(12) United States Patent
Frederick et al.

(10) Patent No.: US 7,960,759 B2
(45) Date of Patent: Jun. 14, 2011

(54) INTEGRATED CIRCUIT LAYOUT PATTERN FOR CROSS-COUPLED CIRCUITS

(75) Inventors: Marlin Wayne Frederick, Austin, TX (US); David Paul Clark, Georgetown, TX (US)

(73) Assignee: ARM Limited, Cambridge (GB)

( * ) Notice: Subject to any disclaimer, the term of this patent is extended or adjusted under 35 U.S.C. 154(b) by 345 days.

(21) Appl. No.: 12/285,795

(22) Filed: Oct. 14, 2008

(65) Prior Publication Data

US 2010/0090260 A1 Apr. 15, 2010

(51) Int. Cl.
*H01L 23/52* (2006.01)

(52) U.S. Cl. .................... 257/208; 257/E27.108

(58) Field of Classification Search .............. 257/208, 257/209, 210, E27.108; 327/202
See application file for complete search history.

(56) References Cited

U.S. PATENT DOCUMENTS

| | | | | |
|---|---|---|---|---|
| 5,223,733 A * | 6/1993 | Doi et al. ..................... | 257/386 |
| 5,684,311 A * | 11/1997 | Shaw ........................ | 257/206 |
| 6,144,241 A * | 11/2000 | Wong ........................ | 327/202 |
| 6,800,883 B2 * | 10/2004 | Furuya et al. ............... | 257/206 |
| 7,638,822 B1 * | 12/2009 | de Jong et al. .............. | 257/206 |
| 2004/0089881 A1 * | 5/2004 | Ono ........................ | 257/208 |
| 2008/0105904 A1 * | 5/2008 | Sumikawa et al. ........... | 257/202 |

* cited by examiner

*Primary Examiner* — Jerome Jackson, Jr.
*Assistant Examiner* — Paul A Budd
(74) *Attorney, Agent, or Firm* — Nixon & Vanderhye P.C.

(57) ABSTRACT

A circuit 32 is provided comprising a first diffusion region 34 and a parallel second diffusion region 36. A sequence of N gate layers 40, 42, 46 is provided with a first and an Nth of these gate layers covering different respective ones of the diffusion regions 34, 36 whilst the middle (N−2) gate layers 42 cover both diffusion regions 34, 36. A bridging conductor 64 connects the first gate layer 40 and the Nth gate layer 46. In some embodiments, the second diffusion region is provided as two second diffusion sub-regions 68, 70 having a diffusion region gap 74 therebetween and electrically connected via a jumper connector 42. A first gate layer 76 which forms a gate electrode with a first diffusion region 66 can extend through this diffusion region gap 74 not forming a gate electrode therewith and facilitating use of a collinear bridging conductor 82 to connect to the Nth gate layer 80.

16 Claims, 5 Drawing Sheets

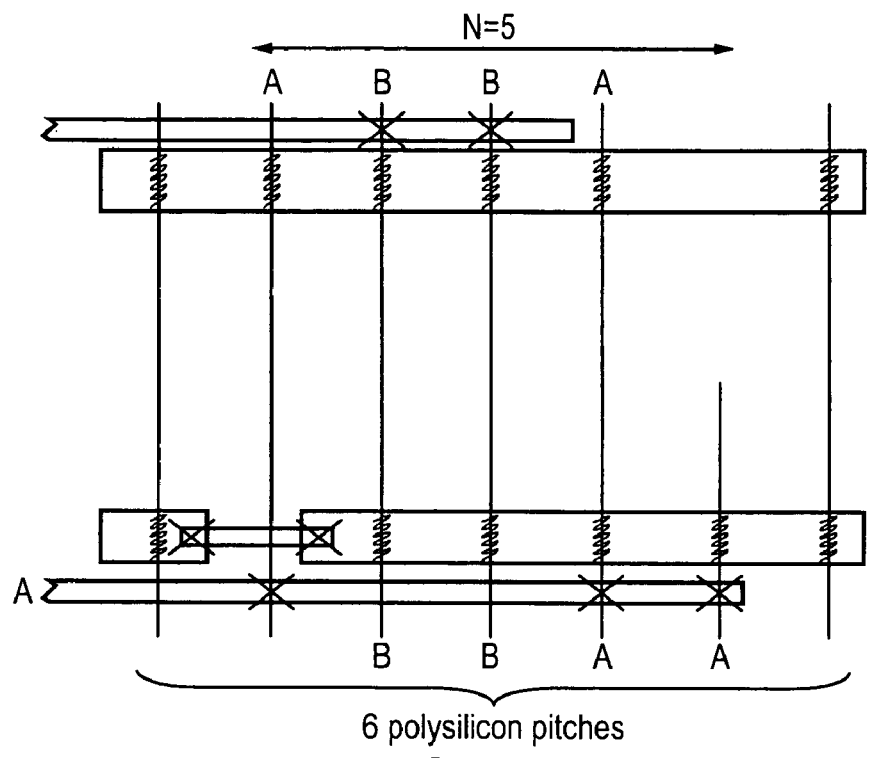
FIG. 5
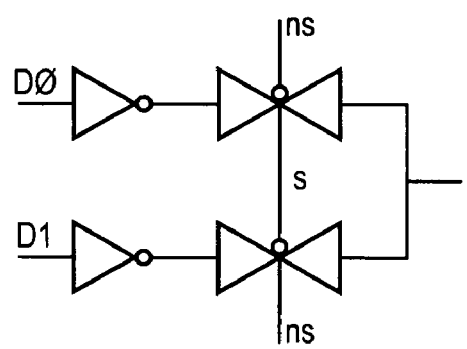
FIG. 6A
Oiler Path Trace
    P-type gate signals ⇒ DØ ns s D1
    N-type gate signals ⇒ DØ s ns D1
                               ⇓ null insert
\* = null positions in
   diffusion region, i.e.
   gate electrode not present
                          DØ Ø\* ns S D1
                          DØ S   ns D1
                                 ⇓ null insert
                          DØ Ø ns s D1
                          DØ s ns Ø\* D1
FIG. 7

INTEGRATED CIRCUIT LAYOUT PATTERN FOR CROSS-COUPLED CIRCUITS

BACKGROUND OF THE INVENTION

1. Field of the Invention

This invention relates to the field of integrated circuit layout. More particularly, this invention relates to integrated circuit layout suitable for cross-coupled circuits.

2. Description of the Prior Art

A frequent circuit primitive within integrated circuits involves the cross-coupling of signals used to control the gates in adjacent diffusion regions. A sequence of gates formed along a first diffusion region will have a given sequence of signals controlling those gates and in a second adjacent diffusion region it is efficient to provide gates with control signals following the same sequence so that the gate layers can extend between the diffusion regions. However, in the case of cross-coupled circuits, which in practice are quite common, the order of two signals is reversed in one diffusion region compared with another diffusion region.

FIG. 1 illustrates a known layout solution to the above cross-coupling problem. In this solution a first diffusion region 2 is formed in a substrate substantially parallel to a second diffusion region 4. A sequence of gate layers 6, 8, 10, 12 (typically formed of polysilicon) are then formed overlapping the diffusion regions 2, 4 as shown. Where a gate layer 6, 8, 10, 12 overlaps a diffusion region 2, 4 there is formed a gate electrode 14, 16, 18, 20, 22, 24, 26 and 28. As illustrated, the sequence of control signals for the gate electrodes 14, 16, 18, 20 of the first diffusion region 2 (considered from left-to-right as shown in FIG. 1) includes the control signal sequence "A" followed by "B" in respect of the gate electrodes 16, 18. This ordering of control signals is reversed in respect of the gate electrodes 24, 26 formed on the second diffusion region 4.

In order to accommodate this cross-coupling it will be seen that the gate layer 8 has a rectilinear form including a portion running parallel to the first diffusion region 2 and the second diffusion region 4. The gate layer 10 is connected via a bridging conductor 30 formed in the first metal layer deposited over the gate layers 6, 8, 10, 12 so as to connect to the remaining portion of this gate layer 10' formed overlapping the second diffusion region 4. The bridging conductor 30 is accordingly also rectilinear.

The spacing requirements of the rectilinear gate layer 8, the bridging conductor 30, the connections from the bridging conductor 30 down to the gate layer 10, 10' and the connections to the diffusion region are such that one pitch of gate layers (a polysilicon pitch) must be missed between the gate layers 8 and 10, 10'. This has the result that the structure of FIG. 1 consumes four polysilicon pitches.

An increasingly severe problem with the arrangement of FIG. 1 is that the rectilinear form of the gate layer 8 is becoming difficult to accurately form as the device geometries shrink in size. With a 45 nm process, the rectilinear form is problematic to form with the existing processing techniques, such as the existing lithography. However, as process geometry sizes progress downward toward 32 nm and 22 nm the rectilinear form of gate layer 8 illustrated in FIG. 1 represents a significant problem to accurately form. Similar difficulties arise with the bridging conductor 30, although these are not quite so severe as with the gate layer 8.

SUMMARY OF THE INVENTION

Viewed from one aspect the present invention provides a circuit for use in an integrated circuit, said circuit comprising:

a first collinear diffusion region;

a second collinear diffusion region spaced opposite and substantially parallel to said first diffusion region;

a sequence of N collinear gate layers disposed substantially parallel to each other and perpendicular to said first diffusion region and said second diffusion region and each overlapping one or both of said first diffusion region and said second diffusion region to form gate electrodes; wherein a first gate layer in said sequence overlaps said first diffusion region to form a gate electrode therewith and does not overlap said second diffusion region;

a next (N−2) gate layers in said sequence overlap both said first diffusion region and said second diffusion region to form respective gate electrodes; and an Nth gate layer in said sequence overlaps said second diffusion region to form a gate electrode therewith and does not overlap said first diffusion region; and further comprising a bridging conductor electrically connecting said first gate layer and said Nth gate layer passing said (N−2) gate layers without electrically connecting to at least some of said (N−2) gate layers.

The present technique recognises that an alternative layout is possible which consumes no greater number of polysilicon pitches and yet does not require the provision of rectilinear gate layers. This is achieved by utilising a null position along each of the diffusion layers at the ends of the sequence of cross-coupled signals such that the gate layers within that sequence not at the edge can be pure collinear forms overlapping both diffusion regions and the gate layers at the edges can similarly be pure collinear forms overlapping only one of the diffusion regions. A bridging conductor can then be used to electrically connect the outermost gate layers in the sequence.

In one embodiment the first diffusion region and the second diffusion region can each comprise a single contiguous diffusion region. In this type of embodiment the first gate layer does not overlap the second diffusion region and the Nth gate layer does not overlap the first diffusion region. While this layout requires only collinear gate layers, it does require a rectilinear bridging conductor (L-shaped or cranked) in order to traverse the displacement between the first and Nth gate layers measured both parallel to the diffusion regions and perpendicular to the diffusion regions.

In a further embodiment the first diffusion region is a single contiguous diffusion region and the second diffusion region comprises two second diffusion sub-regions separated by a diffusion region gap and electrically connected by a jumper conductor. The provision of the second diffusion region in this way with a diffusion region gap therein permits the first gate layer to extend through the diffusion region gap (and not overlap with the second diffusion region—thereby forming no gate electrode). The jumper conductor electrically connecting the two second diffusion sub-regions permits these to act electrically (but not physically) as if they were a single contiguous diffusion region in the normal way.

Providing the second diffusion region with such a diffusion region gap allows the first gate layer to extend through this diffusion region gap and this in turn permits the bridging conductor to be a collinear bridging conductor substantially parallel to the first diffusion region and the second diffusion region since the separation between the first gate layer and the Nth gate layer measured perpendicular to the diffusion regions can be removed. This facilitates manufacture of the bridging conductor.

It will be appreciated that the number of gate pitches within the sequence can vary depending upon the complexity and requirements of the circuit primitive being formed. The present technique provides a particular advantage when N=3 and when N=5, although it may be used for larger values of N including at least values given by N=5+(i*4), where i is a positive integer.

It will be appreciated that the sequence of gate layers may not be sufficient to form the circuit primitive (circuit cell) that in most cases will be required. Accordingly, in some example layouts one or more further gate layers are disposed adjacent to at least one side of the sequence.

It will be appreciated by those in this technical field that the gate layers could be formed in a variety of different materials. Particularly suitable gate layer materials with which the present technique may be used with advantage are polysilicon and metal. Polysilicon gate layers are common in the production of integrated circuits at small geometries and metal gates are becoming increasingly common.

It will be understood that the bridging conductor and the jumper conductor can be provided in a variety of different ways by the process for forming the layout. A convenient way of providing these elements is as part of a first metal layer overlying the gate layers.

Viewed from another aspect the present invention provides a method of forming a circuit for use in an integrated circuit, said method comprising the steps of:

forming a first collinear diffusion region;

forming a second collinear diffusion region spaced opposite and substantially parallel to said first diffusion region;

forming a sequence of N collinear gate layers disposed substantially parallel to each other and perpendicular to said first diffusion region and said second diffusion region and each overlapping one or both of said first diffusion region and said second diffusion region to form gate electrodes; wherein a first gate layer in said sequence overlaps said first diffusion region to form a gate electrode therewith and does not overlap said second diffusion region;

a next (N−2) gate layers in said sequence overlap both said first diffusion region and said second diffusion region to form respective gate electrodes; and an Nth gate layer in said sequence overlaps said second diffusion region to form a gate electrode therewith and does not overlap said first diffusion region; and further comprising the step of forming a bridging conductor electrically connecting said first gate layer and said Nth gate layer passing said (N−2) gate layers without electrically connecting to at least some of said (N−2) gate layers.

The above, and other objects, features and advantages of this invention will be apparent from the following detailed description of illustrative embodiments which is to be read in connection with the accompanying drawings.

BRIEF DESCRIPTION OF THE DRAWINGS

FIG. 5 is a further embodiment that is a variation of the embodiment of FIG. 4 in which a collinear bridging conductor is permitted;

FIGS. 6A, 6B, 6C and 6D are a higher level representations of example cross-coupled circuits which it may be desired to form with the integrated circuit layout as previously discussed;

FIG. 7 illustrates how Oiler path trace techniques may be adapted to generate layout patterns utilising the present techniques.

DESCRIPTION OF THE PREFERRED EMBODIMENTS

Figure 2:
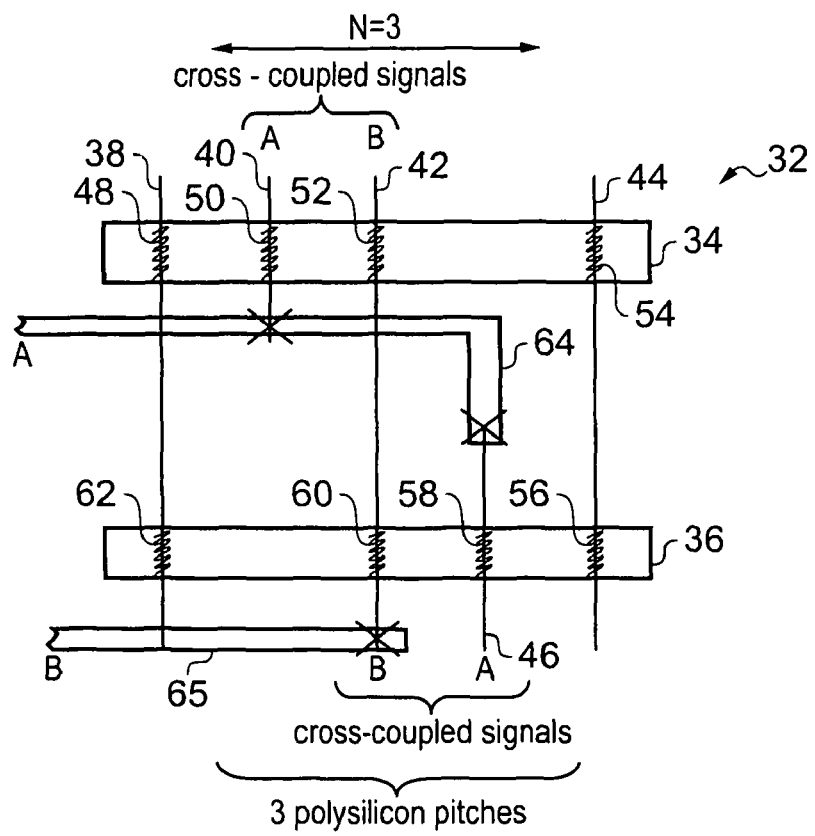
FIG. 2 schematically illustrates a circuit layout permitting cross-coupled signals between gate electrodes formed over different diffusion regions whilst maintaining collinear gate layers.

FIG. 2 schematically illustrates a circuit layout for forming part of a circuit primitive or circuit cell within an integrated circuit. It will be appreciated that many other circuit elements and layout layers will often be provided in addition to the layout illustrated in FIG. 2. These additional elements and layers have been omitted for the sake of clarity. The circuit 32 includes a first diffusion region 34 and a second diffusion region 36 formed within a substrate—these diffusion regions are of different diffusion types, i.e. one produces P-type gates and one produces N-type gates. Gate layers formed of polysilicon run perpendicular to the diffusion regions 34, 36 and in the example illustrated there are gate layers 38, 40, 42 and 44 overlapping the first diffusion region 34. A gate layer 46 is provided which only overlaps the second diffusion layer 36. The gate layers 38, 42 and 44 overlap both the first diffusion region 34 and the second diffusion region 36. The outermost two gate layers 38 and 44 are shown by way of example and are not part of the circuit arrangement of the present technique. Where the gate layers 38, 40, 42, 44, 46 overlap the diffusion regions 34, 36 gate electrodes 48, 50, 52, 54, 56, 58, 60, 62 are formed. A bridging conductor 64 which has an L-shape is formed so as to electrically connect the gate layers 40 and 46 and supply the gate signal thereto. A gate signal conductor 65 provides the control signal to gate layer 42. The crosses on the bridging conductor 64, the gate conductor 65 and the conductors shown in the following figures indicates a connection being made from this first layer of metal down to the underlying gate layer or other underlying layer. Traversing the first diffusion region 34 left-to-right as shown in FIG. 2, the signal sequence on the gate electrodes 50 and 52 is "A" followed by "B". Conversely on the second diffusion region 36 the signals controlling the gate electrodes 60 and 58 when similarly read from left-to-right are in the order "B" followed by "A". Thus, the gate signals are cross-coupled between the two diffusion regions 34, 36.

Figure 1:
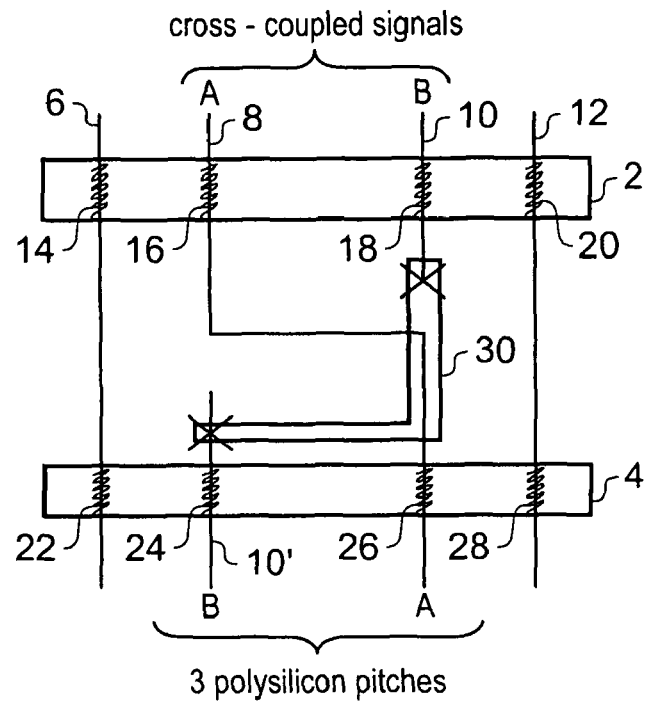
FIG. 1 schematically illustrates a known circuit layout.

The arrangement of FIG. 2 still consumes four polysilicon pitches. Thus, there is no additional overhead compared to the arrangement of FIG. 1 (which in current generations of 65 nm and below technology includes a skipped pitch for reasons relating to the provision of the metal layers). However, in the arrangement of FIG. 2, the gate layers are all formed of pure collinear polysilicon. This is significantly easier to manufacture.

In the example of FIG. 2, the sequence of gate layers forming the core portion of the cross-coupled circuit comprises three gate pitches, namely N=3.

Figure 3:
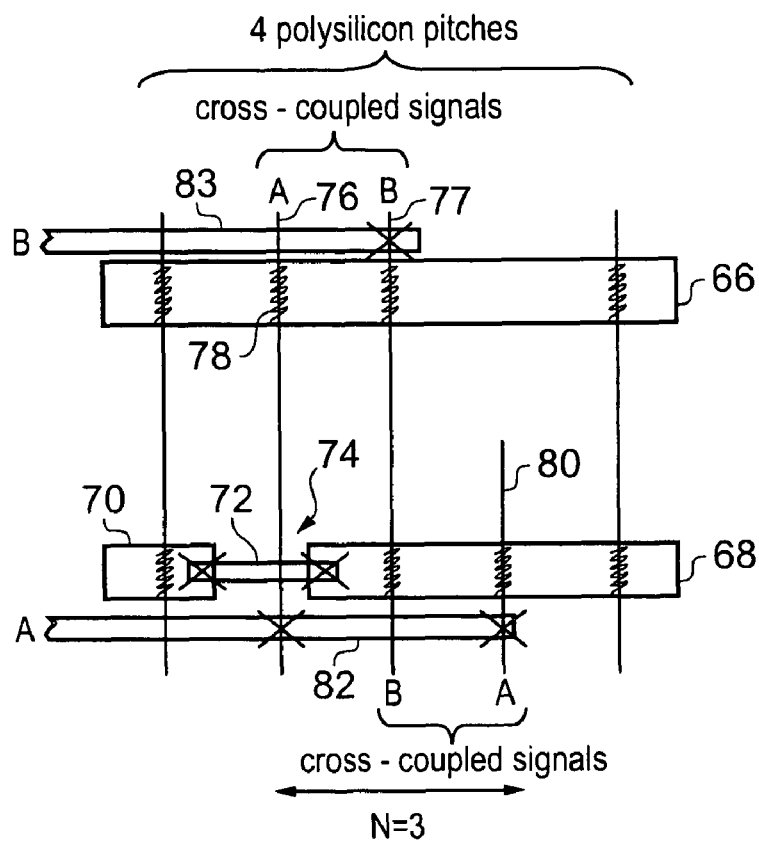
FIG. 3 is a further example embodiment in which a collinear bridging conductor may be used.

FIG. 3 illustrates a further example embodiment. In this example embodiment a first diffusion region 66 is formed as a single contiguous diffusion region. A second diffusion region is formed as two second diffusion sub regions 68, 70. These sub regions are electrically connected via a jumper connection 72, which may be formed as part of the first metal layer above the gate layers. A diffusion region gap is formed between the two second diffusion sub-regions 68, 70.

A first gate layer 76 overlaps the first diffusion region 66 and forms gate electrode 78 thereupon. The first gate layer 76 then passes between the first diffusion region and the second diffusion region 68, 70 passing through the diffusion region gap 74 to extend beyond the second diffusion region 68, 70 without overlapping the second diffusion region 68, 70. The extension of the first gate layer 76 in this way removes the separation in the direction perpendicular to the diffusion regions between the first gate layer 76 and the Nth gate layer 80. This permits the use of a collinear bridging conductor 82. A gate signal conductor 83 provides the control signal to gate layer 77. This collinear bridging conductor 82 is easier to form compare with the rectilinear bridging conductor 64 of FIG. 2. The additional requirement to form a break in the second diffusion region so as to provide the diffusion region gap 74 and the requirement to form the jumper conductor 72 are more than compensated for by the increased ease of manufacture resulting from the use of only collinear forms within the arrangement illustrated in FIG. 3. It will be noted that the arrangement of FIG. 3 has a sequence of gate layers where N=3.

Figure 4:
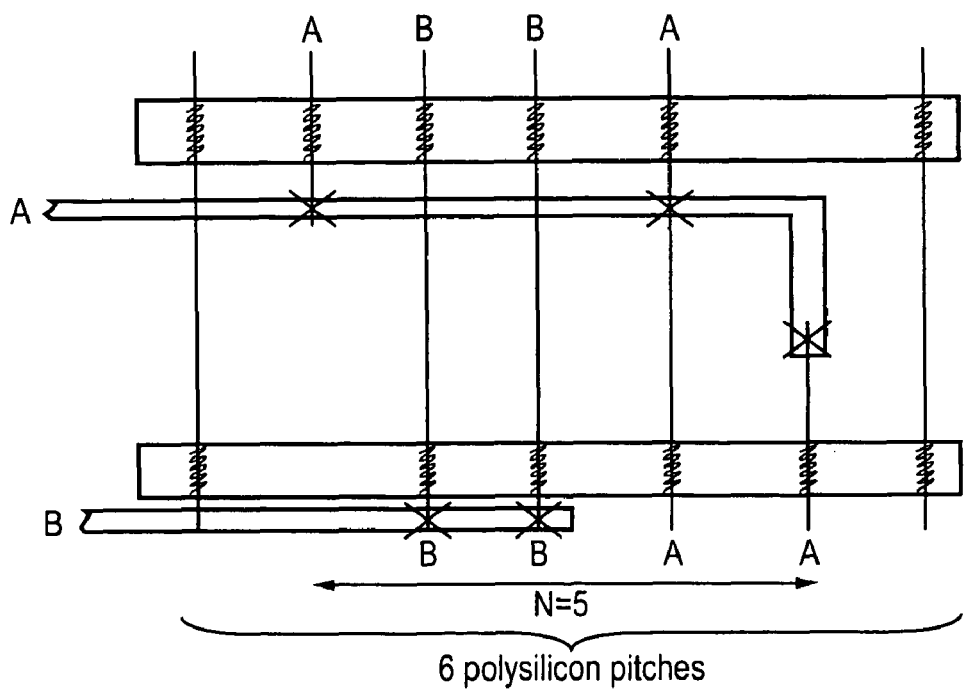
FIG. 4 is a further example embodiment in which the number of gate layers within the sequence of gate layers of FIG. 2 has been increased.
Figure 6B:
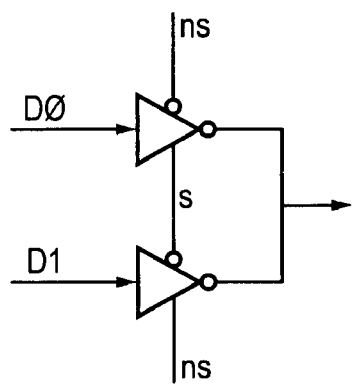
Figure 6C:
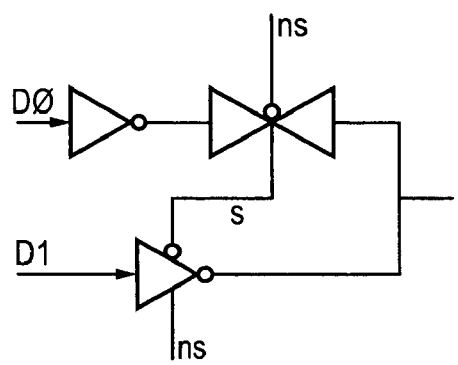
Figure 6D:
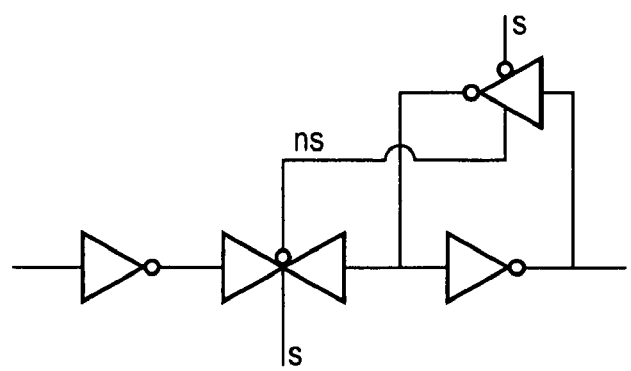

FIG. 4 illustrates a further example embodiment similar to that of FIG. 2. In this example embodiment the sequence has been extended to include five gate layers and N=5.

In a similar way, FIG. 5 illustrates a further embodiment similar to that of FIG. 3 with the number of gate layers in the sequence again being extended such that N=5.

In each of the example embodiments of FIGS. 2, 3, 4 and 5 it will be noted that gate layers are provided at each side of the sequence of gate layers and these further gate layers form additional gate electrodes over the diffusion regions. In this way, many different circuit primitives (circuit cells) can be formed utilising the layout technique described above, which permits cross-coupling of signals (switching their order in different diffusion regions) whilst maintaining collinear forms for at least the gate layers and optionally the bridging conductors.

FIGS. 6A, 6B, 6C and 6D schematically illustrate higher level representations of example circuits which may be implemented using the layout techniques of FIGS. 2, 3, 4 and 5. It will be appreciated that many other forms of circuit employing cross-coupled signals such as signals "s" and "ns" illustrated in FIGS. 6A, 6B, 6C and 6D are also possible.

FIG. 7 illustrates an Oiler path trace in respect of the circuit of FIG. 6A as will be familiar to those in this technical field. Such Oiler path techniques are used to provide more efficient mappings between circuits such as illustrated in FIG. 6A and layout arrangements as illustrated in FIGS. 2, 3, 4 and 5. In particular the paths through the P-type gates may be traced and the gate signals noted. The order of these gate signals can then be compared with the gate signals required in N-type gates through the circuit. If these paths utilise the same sequence of gate signals, then it is possible to align the gate layers and form common gate layers between adjacent diffusion regions respectively providing the gates electrodes in the traced paths.

As illustrated in FIG. 7, the Oiler path trace for the circuit of FIG. 6A shows that the sequence of gate signals it not the same between the two layers as the "ns" and "s" signals are inverted in order between the two paths. This is a cross-coupling situation in which the technique of FIG. 1 has previously been used. However, with the present technique, the Oiler paths traced can be analysed and, in two passes, nulls inserted in the sequence of control signals (these correspond to positions on a diffusion region at which a gate electrode is not formed) in order that the gate signals between adjacent paths align better and accordingly may be more efficiently implemented in adjacent diffusion regions. Thus, the present technique in one form can be considered as a modified form of Oiler path analysis in which nulls are inserted in the gate positions of diffusion regions so as to align gate signals between diffusion regions when a cross-coupled signal sequence is identified between adjacent diffusion regions (Oiler paths).

Higher order embodiments are also possible with higher values of N. In some embodiments, one or more dummy layers of polysilicon may run between the diffusion regions embedded within, but not forming part of, the sequence of gate layers. This helps meet other design requirements, such that a gate layer should not be bordered by neighbouring gate layers carrying complementary signals. There may be any combination in the middle of the cross-coupled section of the circuit and bounded by the fundamental pattern. Such variants are useful and encompassed within the present technique.

Figure 8:
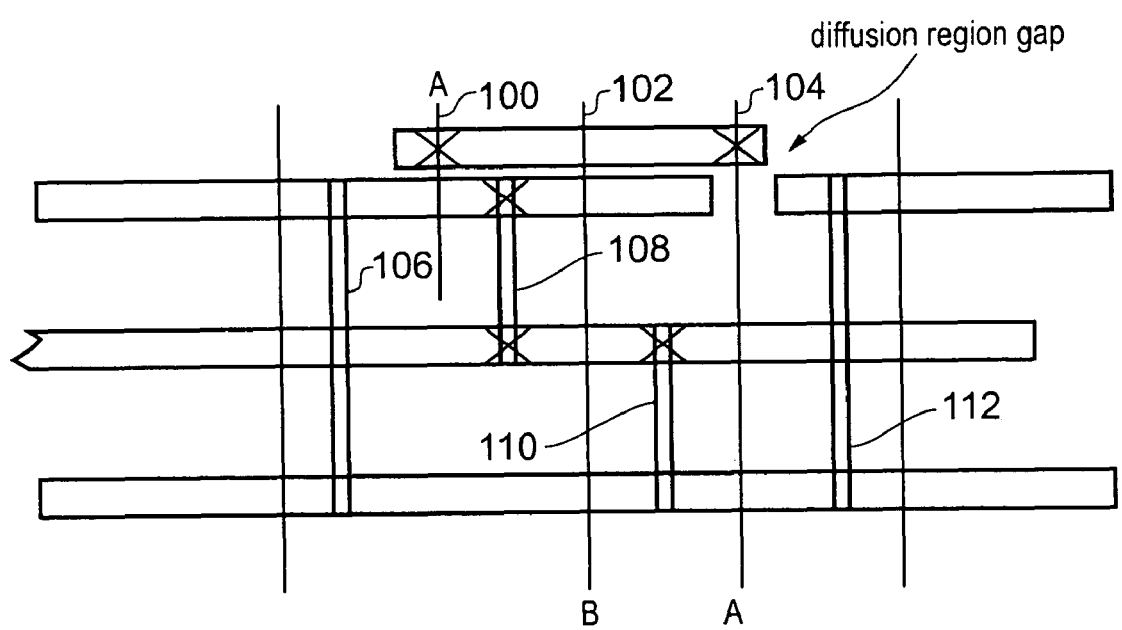
FIG. 8 schematically illustrates an example embodiment having a central sequence of three gate layers with cross-coupling similar to FIG. 3 and also using local interconnect layers parallel to the gate layers.

FIG. 8 schematically illustrates an example embodiment having a central sequence of three gate layers 100, 102 and 104 with cross-coupling similar to FIG. 3 and also using local interconnect layers 106, 108, 110 and 112 parallel to the gate layers. The line running across the centre of the circuit of FIG. 8 parallel to the diffusion regions is a metal layer.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A circuit for use in an integrated circuit, said circuit comprising:
   a first collinear diffusion region;
   a second collinear diffusion region spaced opposite and substantially parallel to said first collinear diffusion region;
   a sequence of N collinear gate layers disposed substantially parallel to each other and perpendicular to said first collinear diffusion region and said second collinear diffusion region and each overlapping one or both of said first collinear diffusion region and said second collinear diffusion region to form gate electrodes; wherein
   a first gate layer in said sequence overlaps said first collinear diffusion region to form a gate electrode therewith and does not overlap said second collinear diffusion region;
   a next (N−2) gate layers in said sequence overlap both said first collinear diffusion region and said second collinear diffusion region to form respective gate electrodes; and
   an Nth gate layer in said sequence overlaps said second collinear diffusion region to form a gate electrode therewith and does not overlap said first collinear diffusion region; and further comprising
   a bridging conductor electrically connecting said first gate layer and said Nth gate layer passing said (N−2) gate layers without electrically connecting to at least some of said (N−2) gate layers.

2. A circuit as claimed in claim 1, wherein said first collinear diffusion region and said second collinear diffusion region are each a single contiguous diffusion region.

3. A circuit as claimed in claim 2, wherein said bridging conductor includes a first portion substantially parallel to said first collinear diffusion region and said second collinear diffusion region and a second portion substantially perpendicular to said first collinear diffusion region and said second collinear diffusion region and a second portion.

4. A circuit as claimed in claim 1, wherein said second collinear diffusion region comprises two second diffusion sub-regions separated by a diffusion region gap and electrically connected by a jumper conductor.

5. A circuit as claimed in claim 4, wherein said first gate layer extends through said diffusion region gap so as not to overlap said two second diffusion sub-regions.

6. A circuit as claimed in claim 4, wherein said first collinear diffusion region is a single contiguous diffusion region and said Nth gate layer does not overlap said first collinear diffusion region.

7. A circuit as claimed in claim 5, wherein said bridging conductor comprises a collinear bridging conductor substantially parallel to said first collinear diffusion region and said second collinear diffusion region and electrically connecting a portion of said first gate layer extending through said diffusion region gap with said Nth gate layer.

8. A circuit as claimed in claim 1, wherein N=3.

9. A circuit as claimed in claim 1, wherein N=5.

10. A circuit as claimed in claim 1, wherein N=5+(i*4), where i is a positive integer.

11. A circuit as claimed in claim 1, comprising one or more further gate layers disposed adjacent at least one side of said sequence, parallel to each other and perpendicular to said first collinear diffusion region and said second collinear diffusion region and each overlapping both of said first collinear diffusion region and said second collinear diffusion region to form gate electrodes.

12. A circuit as claimed in claim 1, wherein said gate layers are formed of polysilicon.

13. A circuit as claimed in claim 1, wherein said gate layers are formed of metal.

14. A circuit as claimed in claim 1, wherein said bridging conductor is part of a first metal layer overlying said gate layers.

15. A circuit as claimed in claim 4, wherein said jumper conductor is part of a first metal layer overlying said gate layers.

16. A method of forming a circuit for use in an integrated circuit, said method comprising the steps of:
  forming a first collinear diffusion region;
  forming a second collinear diffusion region spaced opposite and substantially parallel to said first collinear diffusion region;
  forming a sequence of N collinear gate layers disposed substantially parallel to each other and perpendicular to said first collinear diffusion region and said second collinear diffusion region and each overlapping one or both of said first collinear diffusion region and said second collinear diffusion region to form gate electrodes; wherein
  a first gate layer in said sequence overlaps said first collinear diffusion region to form a gate electrode therewith and does not overlap said second collinear diffusion region;
  a next (N−2) gate layers in said sequence overlap both said first collinear diffusion region and said second collinear diffusion region to form respective gate electrodes; and
  an Nth gate layer in said sequence overlaps said second collinear diffusion region to form a gate electrode therewith and does not overlap said first collinear diffusion region; and further comprising the step of
  forming a bridging conductor electrically connecting said first gate layer and said Nth gate layer passing said (N−2) gate layers without electrically connecting to at least some of said (N−2) gate layers.

* * * * *